United States Patent
Song et al.

(10) Patent No.: US 8,237,276 B2
(45) Date of Patent: Aug. 7, 2012

(54) BUMP STRUCTURE AND FABRICATION METHOD THEREOF

(75) Inventors: Chi Jung Song, Daejeon-si (KR); In Soo Kang, Chungcheongbuk-do (KR); Gi Jo Jung, Chungcheongbuk-do (KR); Yun Mook Park, Chungcheongbuk-do (KR); Eung Ju Lee, Chungcheongbuk-do (KR); Jun Kyu Lee, Incheon-si (KR); Jung Won Lee, Chungcheonbuk-do (KR)

(73) Assignee: NEPES Corporation, Chungbuk (KR)

( * ) Notice: Subject to any disclaimer, the term of this patent is extended or adjusted under 35 U.S.C. 154(b) by 76 days.

(21) Appl. No.: 12/831,256

(22) Filed: Jul. 7, 2010

(65) Prior Publication Data

US 2011/0285015 A1 Nov. 24, 2011

(30) Foreign Application Priority Data

May 23, 2010 (KR) .................. 10-2010-0047802

(51) Int. Cl.
 *H01L 23/48* (2006.01)
(52) U.S. Cl. ............. 257/737; 257/738; 257/E23.024; 257/E23.025; 257/E23.07; 257/E21.508; 438/666
(58) Field of Classification Search ............ 257/737, 257/738, E23.024, E23.025, E23.07, E21.508; 438/666
See application file for complete search history.

(56) References Cited

U.S. PATENT DOCUMENTS

| 2009/0130840 A1* | 5/2009 | Wang et al. | 438/614 |
| 2011/0193227 A1* | 8/2011 | Chuang et al. | 257/738 |

* cited by examiner

*Primary Examiner* — Tu-Tu Ho (57) ABSTRACT

There is provided a bump structure for a semiconductor device, comprising a metal post formed on and electrically connected to an electrode pad on a substrate, a solder post formed on the top surface of the metal post, said solder post having the same horizontal width as the metal post and the top surface of the solder post being substantially rounded, and an intermetallic compound layer disposed at the interface between the metal post and the solder post. An oxide layer formed on the solder post prevents solder post under reflow from being changed into a spherical shape. An intermetallic compound layer may be formed by an aging process at the interface between the metal post and the solder post. The bump structure can realize fine pitch semiconductor package without a short between neighboring bumps.

6 Claims, 11 Drawing Sheets

FIG. 1

RELATED ART

BUMP STRUCTURE AND FABRICATION METHOD THEREOF

CROSS-REFERENCE TO RELATED APPLICATIONS

This application claims priority and the benefit of Korean Patent Application No. 10-2010-47802 filed on May 23, 2010 in the Korean Intellectual Property Office, the entire contents of which are incorporated herein by reference.

BACKGROUND

1. Technical Field

The present disclosure relates to a bump structure for a semiconductor device, and more particularly, to a new bump structure and a fabrication method thereof for fine pitch semiconductor package.

2. Discussion of Related Art

As personal computers, portable phones, personal information terminals and electronic products have become small, light and been functionalized, data processing capacity has greatly increased. In accordance with this tendency, a wafer level chip scale package to be very close to the size of a semiconductor chip is regarded in semiconductor packages.

Generally, in the wafer level chip scale package, a wafer is packaged and cut after a wafer fabrication process. As a result, a process of the wafer level chip scale package is much simpler than that of a general packaging process through die bonding, wire bonding and molding processes. Further, the wafer level chip scale package provides an advantage of forming solder bumps of all chips on a single wafer at once. Further, the wafer level chip scale package is capable of testing an operation of each chip on the wafer, thereby incurring less fabrication costs, compared to conventional general packages.

Figure 1:
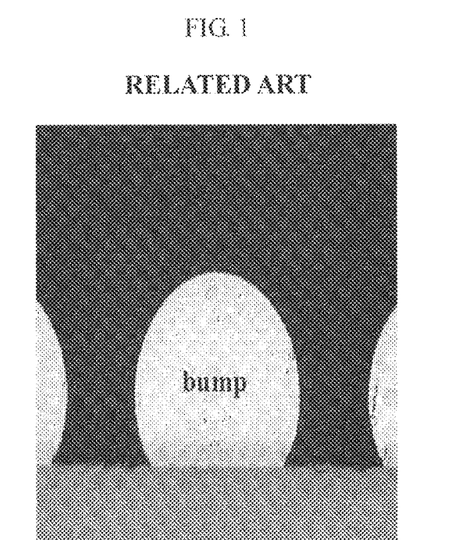
FIG. 1 is a sectional view of a conventional bump structure.

As the integration density of a semiconductor device gets larger and the size of the device gets smaller, bumps in semiconductor package becomes smaller and the distance between neighboring bumps becomes extremely narrow. Solder used as a general bump material has usually spherical shape, as shown in FIG. 1. Solder bump is transformed during reflow process into spherical shape, which causes the increase of horizontal width of a bump and resultantly reduces the distance between neighboring bumps. Thus, a spherical solder bump is not suitable for a semiconductor package with fine-pitch bumps.

Fine-pitch flip chip bump for a semiconductor package should be required to be formed in a cylindrical shape with high aspect ratio, and be fabricated without spreading out laterally in order to avoid a short between bumps.

Furthermore, there have been many defects in assembly of a package and a circuit board, such as dimple, or void in the contact point. Thus, an improved semiconductor package should be required in order to obtain reliability.

SUMMARY

Therefore, an embodiment of the present invention is directed to provide a new bump structure with high aspect ratio.

Another embodiment of the present invention is to provide a method for fabricating a bump structure in which solder volume is increased without expanding the horizontal width.

Still another embodiment of the present invention is to provide a bump structure with enhanced assembling to a circuit board.

In accordance with an aspect of the present invention, the present invention provides a bump structure for a semiconductor device, comprising: a metal post formed on and electrically connected to a electrode pad on a substrate, a solder post formed on the top surface of the metal post, said solder post having the same horizontal width as the metal post and the top surface of the solder post being rounded, and an intermetallic compound layer at the interface between the metal post and the solder post.

In accordance with another aspect of the present invention, the present invention provides a method of fabricating a bump structure for a semiconductor device, the method comprising the steps of: forming a metal post on and electrically connected to a electrode pad on a substrate, forming a solder post on the top surface of the metal post, said solder post having the same horizontal width as the metal post, forming an oxide layer on the surface of the metal post and the solder post, and reflowing the solder post.

According to some embodiments of the present invention, a sufficient stand-off height can be secured for a bump structure without increasing solder volume and realizes a fine-pitch bump structure for a semiconductor device. Relatively high solder post in the bump structure allows a simplified assembly process and low cost for fabrication.

A cylindrical bump structure with a high aspect ratio can be connected to a circuit board without any defect such as dimple or void.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will now be described more fully hereinafter with reference to the accompanying drawings, in which preferred embodiments of the invention are shown.

The present invention provides a pillar type bump structure with a metal post and a solder post, and the main feature of the present invention is that an oxide layer formed on the bump structure prevents the solder post from transforming into a spherical shape in a reflow step.

Figure 2:
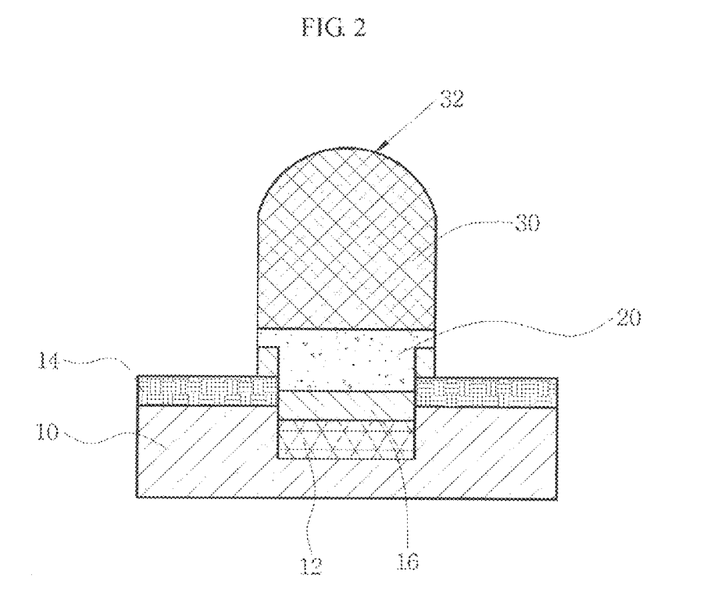
FIG. 2 is a sectional view of a bump structure according to some embodiments of the present invention.

FIG. 2 shows a sectional view of a bump structure in accordance with the present invention. The bump structure includes a metal post (20) in the lower part and a solder post (30) in the upper part. The metal post (20) and the solder post (30) form a single body with a cylindrical shape, and have the same horizontal width. The height of the bump structure is larger than the width. That is, the bump structure has high aspect ratio. This leads to sufficient stand-off height (SOH)

for the bump structure, resulting in easy surface mounting of a semiconductor package with a bump structure in accordance with the present invention.

Especially, the solder post on the metal post has a cylindrical shape, not a spherical shape, which allows extremely narrow distance between two neighboring bumps and can realize a fine pitch semiconductor package.

The metal post (20) is electrically connected to a electrode pad (12) on a substrate (10) The solder post formed on the metal post has a cylindrical body with the same width as the metal post and a rounded top surface (32).

The metal post is composed of, for example, any one or more substances selected from copper or copper alloy, nickel or nickel alloy, vanadium or vanadium alloy, aluminum or aluminum alloy, gold or gold alloy, cobalt or cobalt alloy, and manganese or manganese alloy. The solder post is composed of, for example, Sn or Sn alloy. The solder post is preferable to have low melting point and hardness comparing to the metal post.

Also, the solder post is preferable to have higher vertical length than the metal post. Reducing the amount of the metal post in the whole bump structure cuts cost for fabrication, increasing the volume of the solder leads to remarkably simple process for electrical contact between the bump structure and a circuit board (for instance, a surface mounting process of a semiconductor package).

The substrate (10) in FIG. 2 may be a semiconductor wafer or a semiconductor chip with an integrated circuit thereon, or may be various flip chip device having a bump structure. FIG. 2 shows just one bump structure for convenience' sake. However, it is apparent to those skilled in the art that a plurality of bump structures may be formed on a substrate.

The substrate has a protection layer (14) around the electrode pad (12). A under bump metal (UBM) (16) may be additionally formed between the electrode pad and the metal post in order to enhance the adhesive property of the metal post. Further, an intermetallic compound layer may be formed at the interface between the metal post (20) and the solder post (30), which is described hereinafter.

Figure 3:
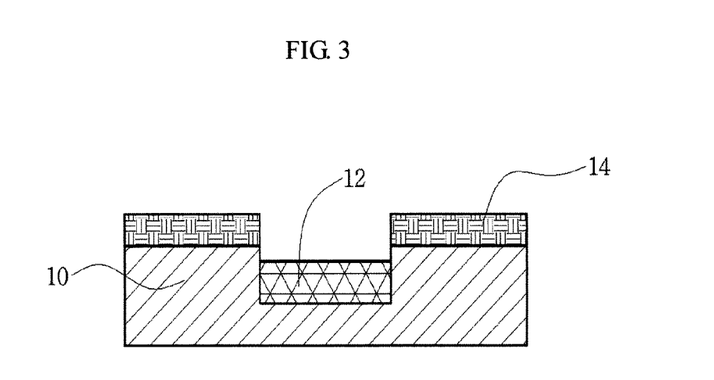
FIGS. 3 to 12 show a fabricating process of a bump structure according to an embodiment of the present invention.

Now, the fabrication of a bump structure in a pillar or cylinder shape is described. First, a substrate (10), for example a wafer or individual semiconductor chip after finishing the front-end process, is prepared (FIG. 3). A protection layer (14) is formed on the surface of the substrate and an electrode pad (12) is partly exposed for forming a bump thereto.

Figure 4:
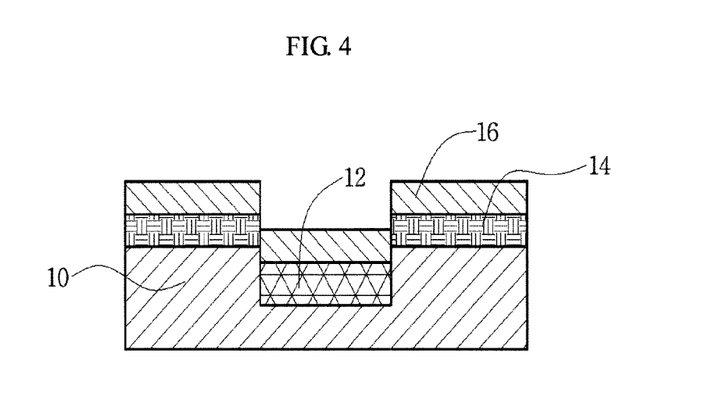
Figure 5:
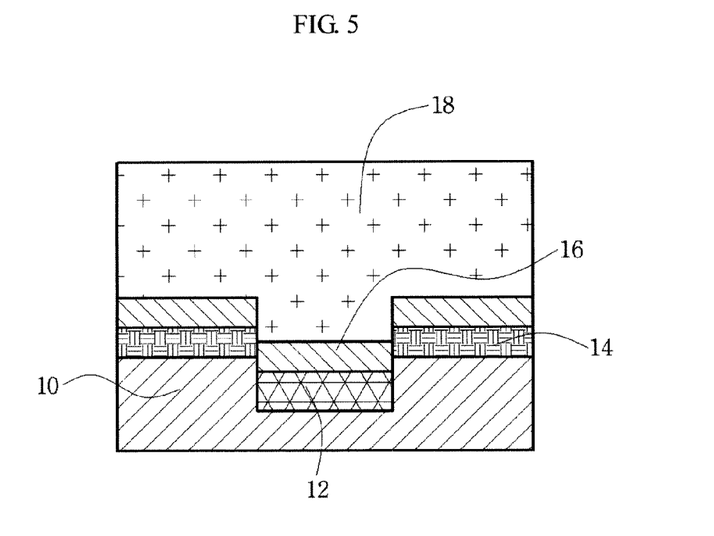

An under bump metal (16) may be formed on the substrate (FIG. 4). The under bump metal may be formed from electroplating or electroless plating using any one or more substances selected from titanium (Ti), Ti alloy, chromium (Cr), Cr alloy, copper (Cu), Cu alloy, nickel (Ni), Ni alloy, gold (Au), and Au alloy, aluminum (Al), Al alloy, vanadium (V), V alloy, and palladium (Pd), Pd alloy.

Figure 6:
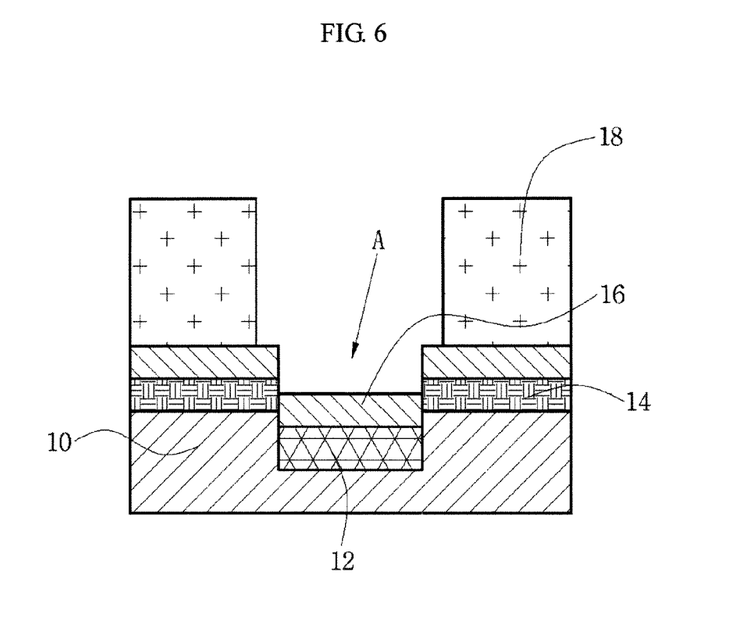

Next, a photoresist (18) is formed on the substrate. The vertical thickness of the photoresist may be changed depending on the desired height of the bump structure. Then, the photoresist is partly removed to expose the electrode at the region (A) for a bump (FIG. 6). The aspect ratio of the bump structure according to some embodiments of the present invention depends on the vertical thickness of the photoresist and the horizontal width of the exposed region. For convenience' sake, only one region (A) is shown in the figures. However, a lot of regions are formed adjacently with each other in the actual device or package.

To lengthen the stand-off height of the bump structure and to reduce the distance between the neighboring bumps, it is necessary to form the photoresist with larger vertical thickness, to make relatively small the horizontal width of the exposed region (A), and to narrow the neighboring exposed regions.

Figure 7:
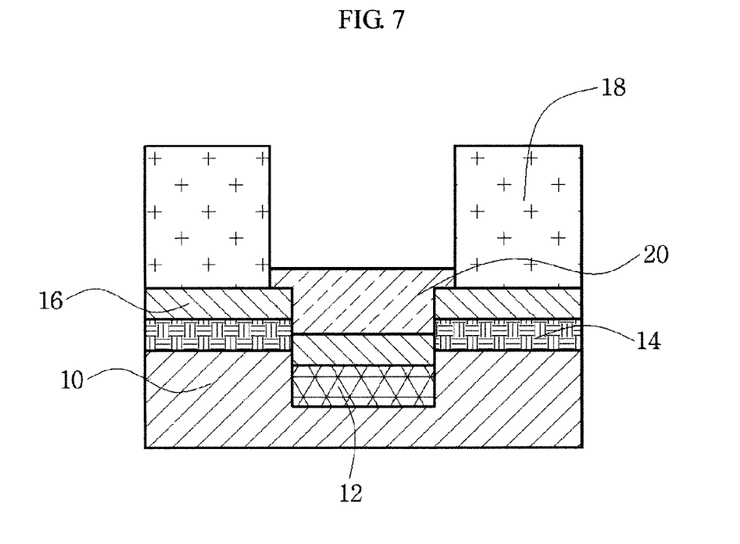

Next, a metal post (20) is formed on the under bump metal (16) at the exposed region (A) to be electrically connected to the electrode pad (FIG. 7). In the preferable embodiment of the present invention, Cu post as a metal post was formed from electroplating. The Cu post had a width of 50 μm and a vertical thickness (height) of 25 μm.

Figure 8:
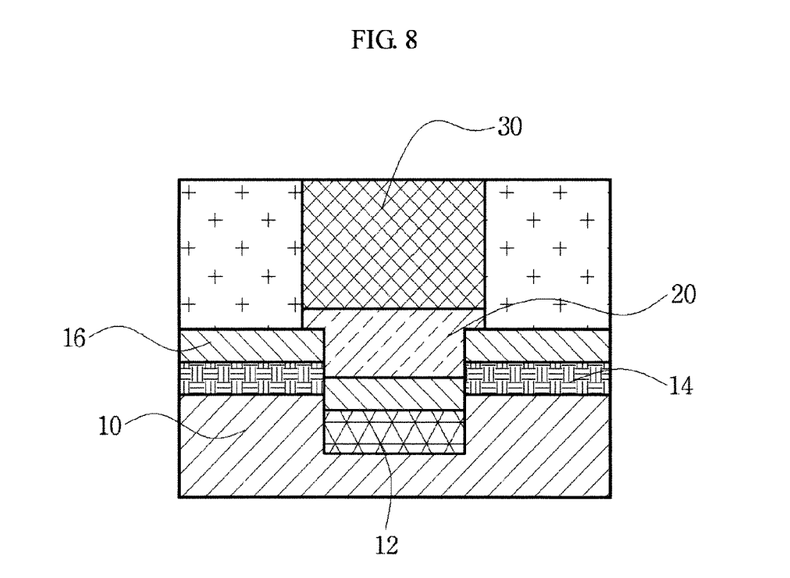
Figure 9:
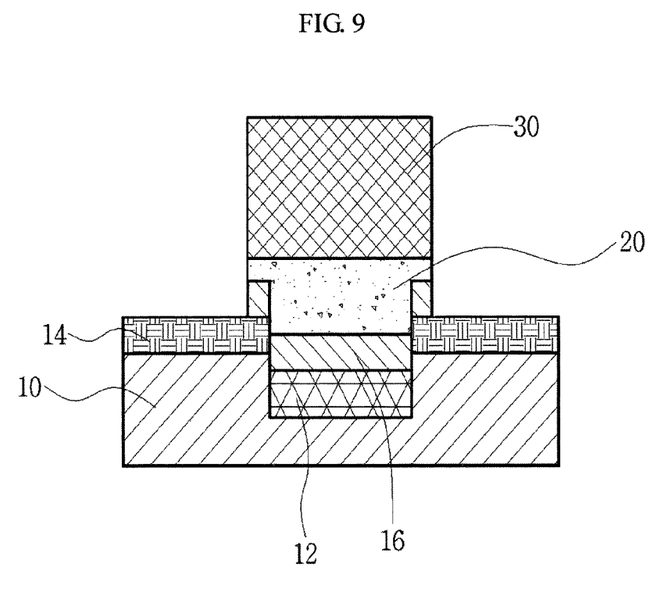

After forming the metal post, a solder post (30) is formed on the metal post at the exposed region (A) (FIG. 8). In the preferable embodiment of the present invention, Sn post as a solder post was formed from electroplating. The Sn post had a width of 50 μm and a vertical thickness (height) of 50 μm. The metal post and solder post have the same width and form one single body in a cylindrical shape. After forming the solder post, the photoresist is completely removed (FIG. 9).

Figure 10:
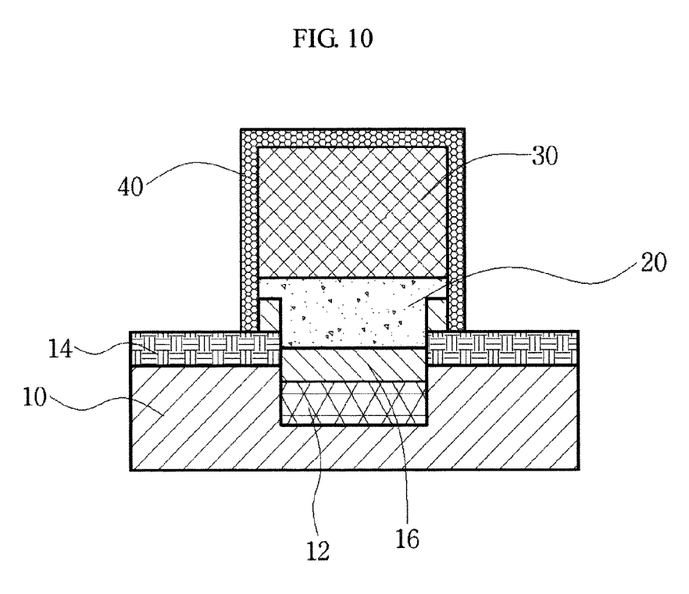

Next, an oxide layer (40) is formed on the surface of the metal post and the solder post (FIG. 10). The oxide layer (40) prevents the solder post from spreading out into an oval figure in the reflow of the bump structure, and keep up the original shape (cylindrical shape) of the solder post.

The oxide layer may be formed on the surface of both the metal post and the solder post, or on the surface of the solder post only. Further, the oxide layer may be formed on the side of the solder post except for the top surface. After the reflow step, the oxide layer may be removed from the bump structure using flux.

Figure 11:
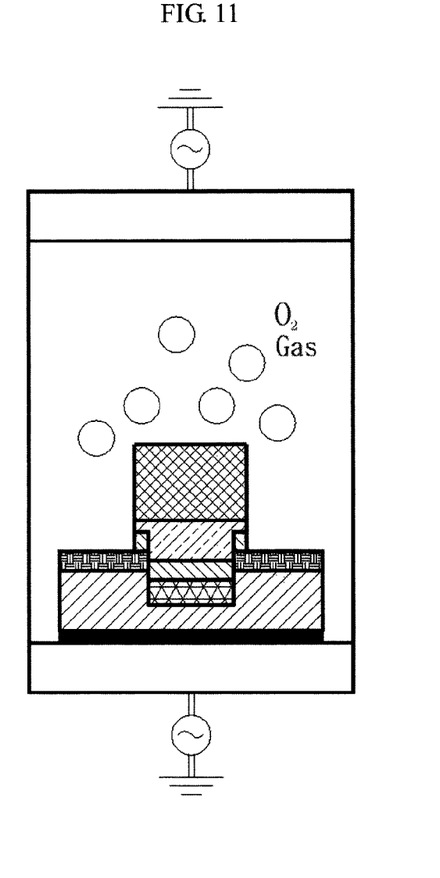

The oxide layer can be formed, for example, in a plasma process. As schematically shown in FIG. 11, the substrate with the bump structure is put into a vacuum chamber, oxygen gas is injected into the chamber, and then high voltage is applied to the chamber to change the injected oxygen in a plasma state. The generated oxygen plasma forms an oxide layer on the surface of the bump structure. In an embodiment of the present invention, oxygen of 1000 sccm and nitrogen of 100 sccm flowed into the chamber, which was kept at pressure of 700 mTorr. Microwave Power of 1000 W and RF Power of 200 W were applied for 35 seconds to the chamber to form the oxide layer.

Figure 12:
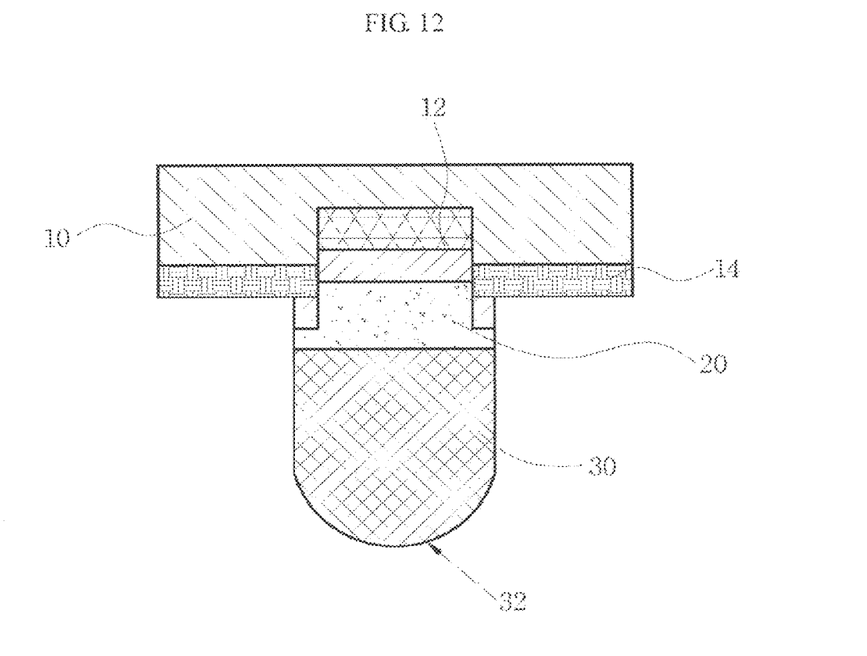

Other methods for forming the oxide layer on the solder post can be used. For example, the bump structure may be kept in the air for long time, be exposed in a wet atmosphere, or be kept in high temperature during the reflow step to form the oxide layer. Next, the bump structure is reflowed. In the reflow process, the oxide layer prevents the solder post from transforming into spherical shape and keeps the original shape thereof. The top surface of the solder post becomes round in the reflow process. In the reflow of the bump structure, as shown in FIG. 12, it is preferable to turn the substrate upside down in order for the top surface (32) of the solder post to face in the gravitational direction. This process prevents the solder post under reflowing from flowing to the metal post or spreading out due to gravity.

Figure 13:
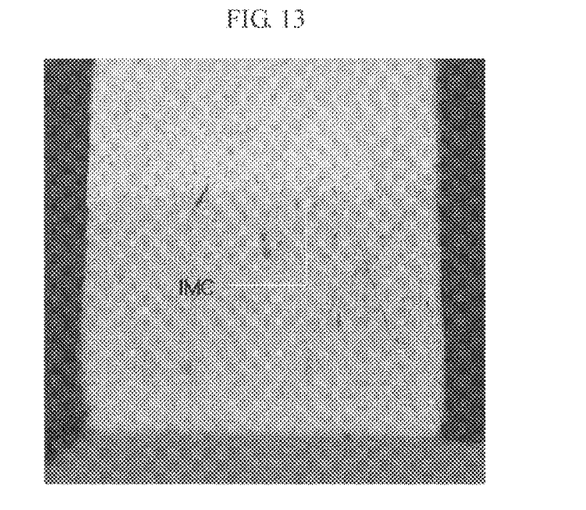
FIGS. 13 and 14 are images showing the bump structure according to an embodiment of the present invention.
Figure 14:
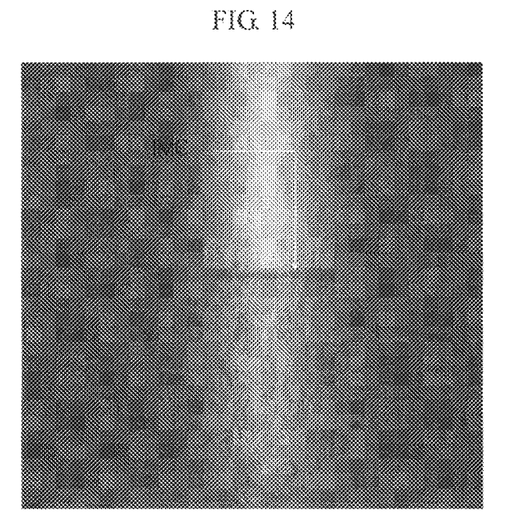

In some embodiments of the present invention, after forming the solder post, an intermetallic compound (IMC) layer may be additionally formed at the interface between the solder post and the metal post by aging process. The intermetallic compound layer functions as a barrier between the metal post and the solder post to prevent the solder post under reflowing from flowing to the metal post at the interface. Furthermore, an oxide layer is formed during the aging process on the surface of the solder post, and the oxide layer can control the flowing of the solder post. Referring to FIGS. 13 and 14, a thin layer of intermetallic compound is shown to be formed between the metal post (I) in the lower part and the solder post (II) in the upper part. The intermetallic compound layer may be formed after forming solder post and before reflowing. In an embodiment of the present invention, after forming the solder post, the bump structure was kept for 2 hours at temperature of 150° C. and was provided with $N_2$ gas of 35 l/min. The aging was performed at the lower temperature than the melting point of the solder post. The melting point of the solder used in the embodiment was about 217° C.

The composition of the intermetallic compound layer may be changed depending on the used material of the metal post and the solder post. For example, in case of using Cu for a metal post and Sn for a solder post, $Cu_3Sn$, or $Cu_6Sn_5$ may be generated as the intermetallic compound. In case of using Ni for a metal post and Sn for a solder post, $Ni_3Sn_4$ may be generated as the intermetallic compound. Furthermore, in case of using Ni and Au for a metal post and Sn for a solder post, various compounds such as $AuSn_4$, $(Au,Ni)_3Sn_2$, $(Au,Ni)_3Sn$, $Au_5Sn$, or $AuSn$ may be generated.

Figure 15:
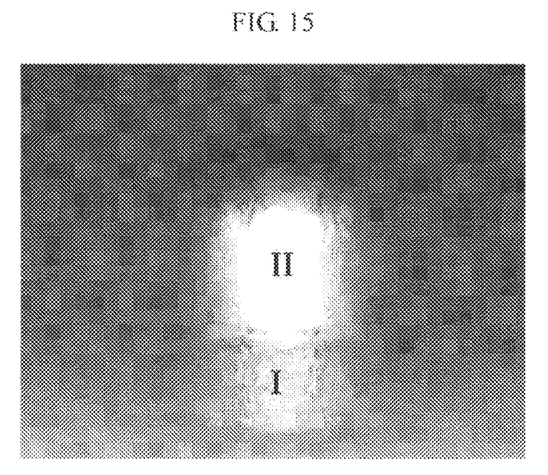
FIG. 15 is an image showing a conventional bump structure
Figure 16:
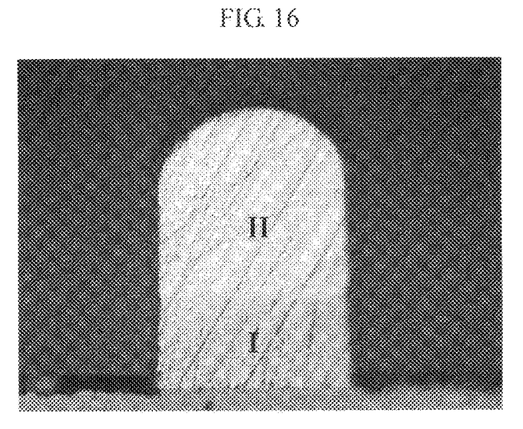
FIGS. 16 and 17 are images showing an intermetallic compound layer in the bump structure.

The finished bump structure according to some embodiments of the present invention, as shown in FIGS. 15 and 16, has one single body with the metal post and the solder post being connected to each other and in a cylindrical shape. The metal post and the solder post have the same horizontal width. Only the top surface of the solder post is rounded.

Figure 17:
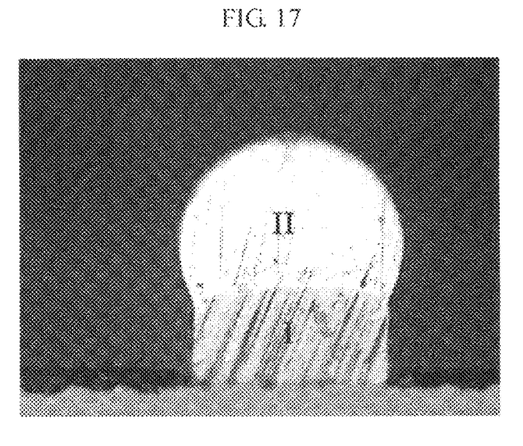

Comparatively, in a bump structure without oxide layer on the surface thereof, the solder post (II) on the metal post (I) spread out and was changed into a spherical or ellipsoidal shape as shown in FIG. 17. The transformation of the solder post lowers the total height of a bump structure, and increases the width of a bump structure, which brings about the risk of short between neighboring bumps.

Figure 18:
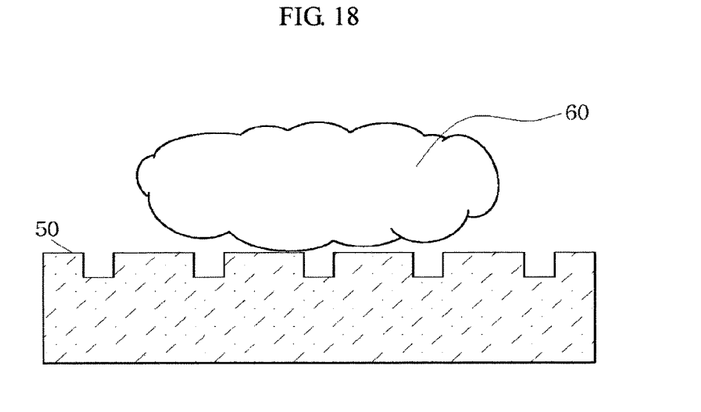
FIGS. 18 to 20 shows an assembly process of a conventional bump structure
Figure 19:
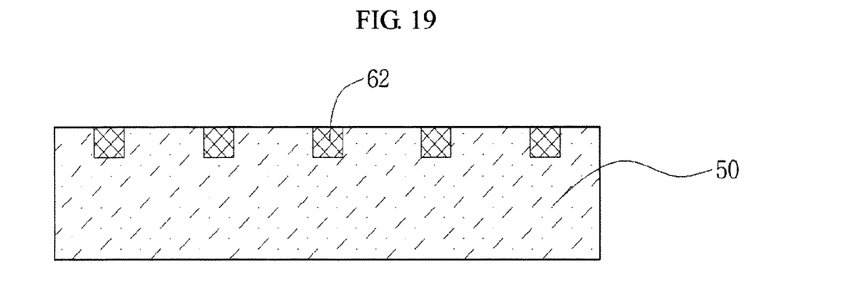
Figure 20:
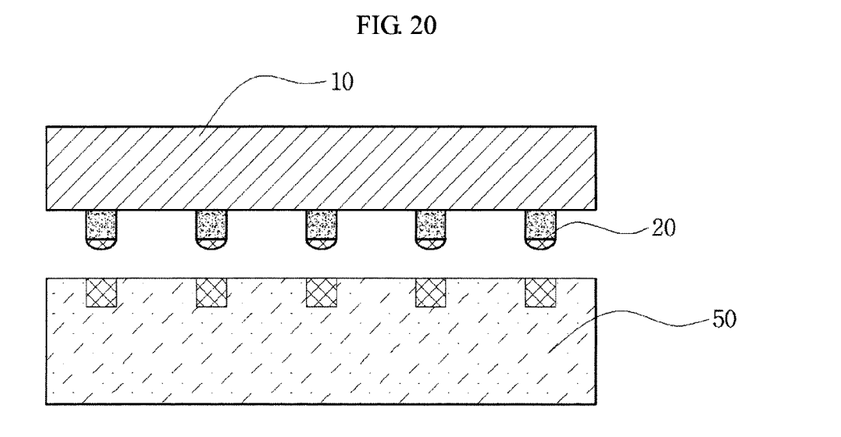

To mount a semiconductor package with bumps on a circuit board (such as PCB, flexible film, or other base substrate for packaging), the circuit board is required to form a solder part for contact. For example, as shown in FIG. 18, the surface of a circuit board (50) is coated with solder paste (60), and the contact part (62) of the circuit board is filled up with solder (FIG. 19). FIG. 20 shows an assembly process where a substrate (10) with a bump structure having only a metal post (20) (or having a metal post and an insufficient solder) is contacting to a circuit board (50).

Figure 21:
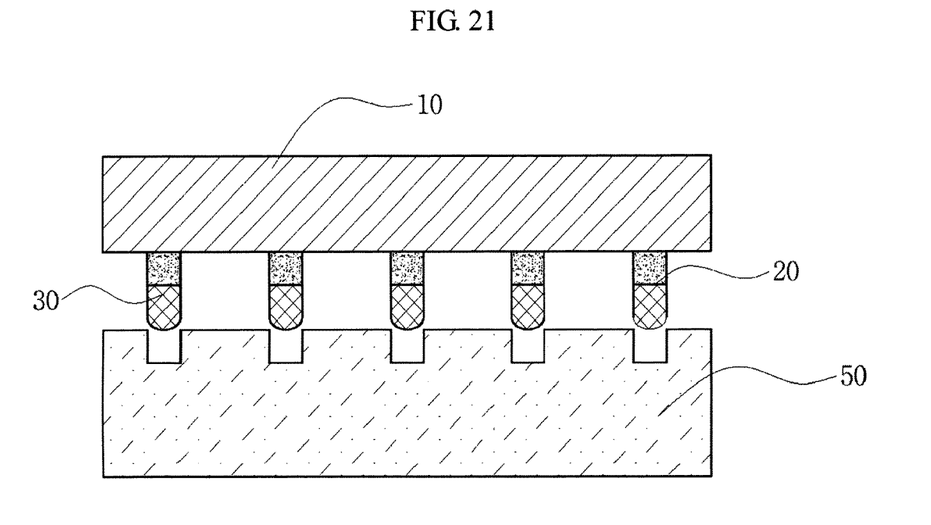
FIG. 21 shows an assembly process of a bump structure according to an embodiment of the present invention.

On the contrary, in accordance with some embodiments of the present invention, since the substrate with a bump structure having a solder post (30) secures stand-off height enough for contact, as shown in FIG. 21, the substrate can be mounted on a circuit board (50) without coating solder paste. Thus, the assembly process of a semiconductor package becomes simplified and the cost for packaging process can be lowered.

Furthermore, in accordance with some embodiments of the present invention, a cylindrical bump structure with high aspect ratio can be fabricated without increasing solder volume. An oxide layer formed on the bump structure allows the top surface of a solder post to be rounded in the reflow process, but prevent the side wall of the solder post from being transformed into spherical shape. In consequence, the bump structure can be excellently contacted to a circuit board without any defect such as dimple or void.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A bump structure for a semiconductor device, comprising:
   a metal post formed on and electrically connected to an electrode pad on a substrate;
   a cylinder type solder post formed on a top surface of the metal post, said solder post having a same horizontal width as the metal post and the top surface of the solder post being substantially rounded; and
   an intermetallic compound layer disposed at an interface between the metal post and the solder post,
   wherein a sidewall of the solder post and a sidewall of the metal post are exposed above the surface of the substrate.

2. The bump structure of claim 1, wherein the solder post is higher than the metal post.

3. The bump structure of claim 1, wherein the substrate is a semiconductor wafer or a semiconductor chip which includes an integrated circuit thereon.

4. The bump structure of claim 1, further comprising a under bump metal between the metal post and the electrode pad.

5. The bump structure of claim 1, wherein the metal post comprises a substance chosen from copper or copper alloy, nickel or nickel alloy, vanadium or vanadium alloy, aluminum or aluminum alloy, gold or gold alloy, cobalt or cobalt alloy, and manganese or manganese alloy.

6. The bump structure of claim 1, further comprising a protection layer over the substrate, wherein substantially all of the exposed sidewall of the metal post is disposed above a top surface of the protection layer.

* * * * *